(12) United States Patent
Towle et al.

(10) Patent No.: US 7,183,658 B2
(45) Date of Patent: Feb. 27, 2007

(54) LOW COST MICROELECTRONIC CIRCUIT PACKAGE

(75) Inventors: Steven Towle, Phoenix, AZ (US); John Tang, Phoenix, AZ (US); John S. Cuendet, Mesa, AZ (US); Henning Braunisch, Chandler, AZ (US); Thomas S. Dory, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/946,749

(22) Filed: Sep. 5, 2001

(65) Prior Publication Data

US 2003/0045083 A1   Mar. 6, 2003

(51) Int. Cl.
*H01L 23/48* (2006.01)

(52) U.S. Cl. ........................ 257/784; 438/106

(58) Field of Classification Search ............... 438/106, 438/612, 617, 622, 637–638, 129; 257/700–701, 257/784, 786, 758, E33.056, E23.001, E21.499
See application file for complete search history.

(56) References Cited

U.S. PATENT DOCUMENTS

| | | | | |
|---|---|---|---|---|
| 4,975,761 A | * | 12/1990 | Chu | 257/686 |
| 5,048,179 A | * | 9/1991 | Shindo et al. | 29/840 |
| 5,055,532 A | | 10/1991 | Hoffman et al. | 525/528 |
| 5,105,257 A | | 4/1992 | Michii | 357/70 |
| 5,346,858 A | | 9/1994 | Thomas et al. | 437/189 |
| 5,353,498 A | | 10/1994 | Fillion et al. | 29/840 |
| 5,355,283 A | | 10/1994 | Marrs et al. | 361/760 |
| 5,422,513 A | | 6/1995 | Marcinkiewicz et al. | 257/668 |
| 5,424,250 A | | 6/1995 | Sawada | |
| 5,497,033 A | | 3/1996 | Fillion et al. | 257/723 |
| 5,508,229 A | | 4/1996 | Baker | 437/183 |
| 5,523,622 A | | 6/1996 | Harada et al. | 257/734 |

(Continued)

FOREIGN PATENT DOCUMENTS

EP   0149317   7/1985

(Continued)

OTHER PUBLICATIONS

Chen, Chang-Lee , et al., "Bond Wireless Multichip Packaging Technology for High-Speed Circuits", *IEEE Transactions on Components, Hybrids, and Manufacturing Technology*, 15, NY, US, (1992), 451-456.

(Continued)

*Primary Examiner*—David Vu
(74) *Attorney, Agent, or Firm*—Blakely, Sokoloff, Taylor & Zafman LLP (57) ABSTRACT

A low cost microelectronic circuit package includes a single build up metallization layer above a microelectronic die. At least one die is fixed within a package core using, for example, an encapsulation material. A single metallization layer is then built up over the die/core assembly. The metallization layer includes a number of landing pads having a pitch that allows the microelectronic device to be directly mounted to an external circuit board. In one embodiment, the metallization layer includes a number of signal landing pads within a peripheral region of the layer and at least one power landing pad and one ground landing pad toward a central region of the layer.

47 Claims, 10 Drawing Sheets

U.S. PATENT DOCUMENTS

| | | | |
|---|---|---|---|
| 5,527,741 A | 6/1996 | Cole et al. | 437/209 |
| 5,608,262 A | 3/1997 | Degani et al. | 257/723 |
| 5,701,032 A | 12/1997 | Fischer et al. | 257/692 |
| 5,703,400 A | 12/1997 | Wojnarowski et al. | 257/723 |
| 5,707,894 A | 1/1998 | Hsiao | 437/209 |
| 5,745,984 A | 5/1998 | Cole, Jr. et al. | 29/834 |
| 5,798,567 A | 8/1998 | Kelly et al. | 257/723 |
| 5,864,470 A | 1/1999 | Shim et al. | 361/777 |
| 5,870,822 A | 2/1999 | Drake et al. | 29/840 |
| 5,888,837 A * | 3/1999 | Fillion et al. | 438/15 |
| 5,892,287 A | 4/1999 | Hoffman et al. | 257/777 |
| 5,939,782 A * | 8/1999 | Malladi | 257/698 |
| 6,002,163 A * | 12/1999 | Wojnarowski | 257/620 |
| 6,014,317 A | 1/2000 | Sylvester | 361/760 |
| 6,025,275 A | 2/2000 | Efland et al. | 438/722 |
| 6,049,465 A | 4/2000 | Blish, II et al. | 361/767 |
| 6,060,777 A | 5/2000 | Jamieson et al. | 257/707 |
| 6,084,297 A | 7/2000 | Brooks et al. | 257/698 |
| 6,084,777 A | 7/2000 | Kalidas et al. | 361/707 |
| 6,130,478 A | 10/2000 | Dumoulin et al. | 257/728 |
| 6,154,366 A | 11/2000 | Ma et al. | 361/704 |
| 6,162,652 A | 12/2000 | Dass et al. | 438/18 |
| 6,222,246 B1 | 4/2001 | Mak et al. | 257/532 |
| 6,239,482 B1 * | 5/2001 | Fillion et al. | 257/678 |
| 6,242,282 B1 | 6/2001 | Fillion et al. | 438/106 |
| 6,262,579 B1 | 7/2001 | Chazan et al. | 324/537 |
| 6,271,469 B1 | 8/2001 | Ma et al. | 174/52.4 |
| 6,277,669 B1 | 8/2001 | Kung et al. | |
| 6,284,566 B1 * | 9/2001 | Lee et al. | 438/107 |
| 6,287,893 B1 | 9/2001 | Elenius et al. | 438/108 |
| 6,309,912 B1 | 10/2001 | Chiou et al. | 438/118 |
| 6,316,830 B1 | 11/2001 | Lin | 257/737 |
| 6,346,743 B1 * | 2/2002 | Figueroa et al. | 257/723 |
| 6,388,333 B1 | 5/2002 | Taniguchi et al. | 257/777 |
| 6,590,291 B2 * | 7/2003 | Akagawa | 257/774 |
| 2001/0013654 A1 | 8/2001 | Kalida et al. | 257/738 |
| 2002/0008314 A1 | 1/2002 | Takeuchi | 257/697 |
| 2002/0070443 A1 * | 6/2002 | Mu et al. | 257/712 |
| 2002/0158334 A1 | 10/2002 | Vu et al. | 257/723 |

FOREIGN PATENT DOCUMENTS

| | | |
|---|---|---|
| EP | 0361825 | 4/1990 |
| EP | 0431205 | 6/1991 |
| EP | 0476971 | 3/1992 |
| EP | 0611129 | 8/1994 |
| EP | 0777274 | 6/1997 |
| EP | 0877419 | 11/1998 |
| EP | 1111662 | 6/2001 |
| GB | 2174543 | 11/1986 |
| JP | 62-004351 | 1/1987 |
| JP | 10-125721 | 5/1998 |
| JP | 11045955 | 2/1999 |
| JP | 11-204688 | 7/1999 |
| JP | 11312868 | 11/1999 |
| JP | 2000-243870 | 9/2000 |
| JP | 2000-307005 | 11/2000 |
| JP | 2000-349203 | 12/2000 |

OTHER PUBLICATIONS

Daum, W., et al., "Overlay High-Density Interconnect: A Chips-First Multichip Module Technology", *IEEE Computer Society, 26*, Long Beach, CA, US,(1993),23-29.

Gdula, Michael, et al., "An Overlay Interconnect Technology for 1GHz. and Above MCMs", *Proceedings of the Multi Chip Module Conference (MCMC)*, Santa Cruz, US,(1992), 171-174.

Written Opinion from PCT/US02/25089 mailed Nov. 25, 2005; 4 pgs.

International Preliminary Report on Patentability (Chapter II) from PCT/US02/25089 mailed Mar. 13, 2006; 7 pgs.

Substantive/Modified Substantive Examination Adverse Report and Search Report from Malaysian Patent Application No. PI 20023272 mailed May 15, 2006; 12 pgs.

\* cited by examiner

LOW COST MICROELECTRONIC CIRCUIT PACKAGE

FIELD OF THE INVENTION

The invention relates generally to microelectronic circuits and, more particularly, to structures and techniques for packaging such circuits.

BACKGROUND OF THE INVENTION

After a microelectronic circuit chip (i.e., a die) has been manufactured, the chip is typically packaged before it is sold to the public. The package provides both protection for the chip and a convenient and often standardized method for mounting the chip within an external system. The circuit package must include some means for providing electrical communication between the various terminals of the circuit chip and the exterior environment. Many different packaging technologies have been used in the past for providing this communication. The type of package that is used for a particular chip can have a significant impact on the performance of the completed device. Typically, in a high volume manufacturing environment, cost will be a primary concern in selecting a packaging technology. Performance is also a very important criterion. As circuits get smaller and faster, there is an ongoing need for innovative and cost effective packaging technologies.

DETAILED DESCRIPTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to low cost structures and techniques for packaging microelectronic circuit chips. A die is fixed within an opening in a package core to form a die/core assembly. A single metallic build up layer is then formed on the die/core assembly that includes a plurality of large format landing pads having a pitch that is compatible with that of an external circuit board (e.g., a motherboard). The build up layer can then be directly mounted to a corresponding metallization pattern on the external circuit board using any of a variety of mounting techniques including, for example, pin grid array (PGA), ball grid array (BGA), land grid array (LGA), and surface mount technology (SMT). Because the build up layer is allowed to extend out over the package core, adequate space is available for providing signal escape routing within the microelectronic device. Because only a single build up layer is used, the package is relatively inexpensive to fabricate. In one embodiment, the package core includes metallic cladding on a surface thereof for use as a ground plane providing a return path for current in the signal lines coupling the signal pads of the die to the corresponding landing pads of the build up layer. The packaging techniques of the present invention can be used to package a wide variety of microelectronic devices, including microprocessors and multichip modules (MCMs). The techniques can be used, for example, as an alternative to chip scale packaging (CSP) techniques that often fail to provide adequate area to fit all required connections for a chip.

Figure 1:
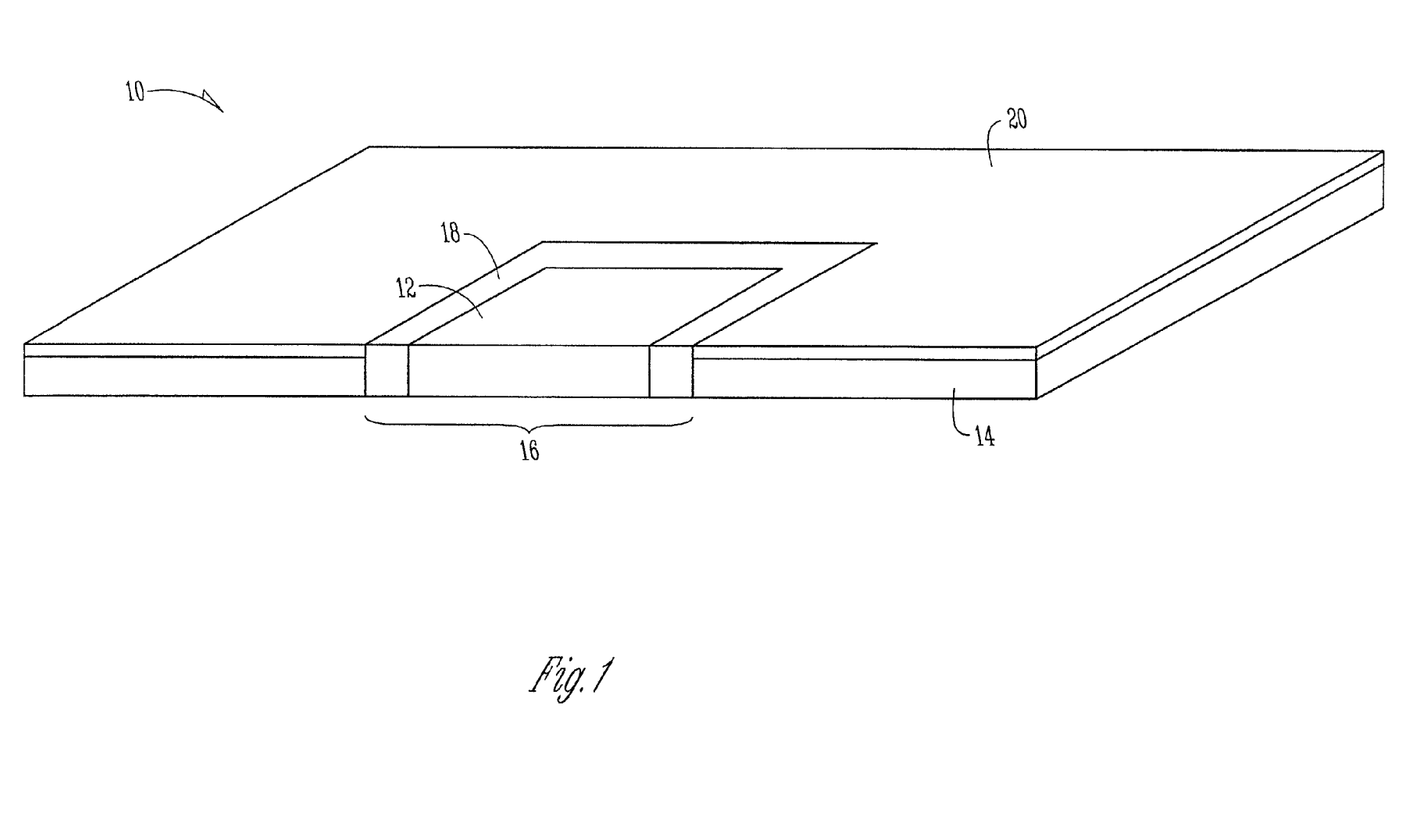
FIG. 1 is a cross-sectional isometric view of a die/core assembly in accordance with one embodiment of the present invention.

FIG. 1 is a cross-sectional isometric view of a die/core assembly 10 in accordance with one embodiment of the present invention. The die/core assembly 10 represents an intermediate stage of a die packaging process in accordance with the present invention. As illustrated, a microelectronic die 12 is fixed within an opening 16 in a package core 14 using an encapsulation material 18. The microelectronic die 12 includes electronic circuitry that is implemented on one or more internal layers. Although not shown in FIG. 1, a number of conductive contacts are distributed on the upper surface of the die 12 (i.e., the active surface) to provide an electrical interface to the circuitry of the die 12. The package core 14 is preferably formed from a dielectric board material (e.g., glass-reinforced epoxy or polyimide) having a conductive cladding 20 (e.g., copper foil) covering at least one surface thereof. Other possible core materials include, for example, copper, copper clad stainless steel, and copper clad ceramic. The opening 16 within the package core 14 can extend through the core 14 (as shown in FIG. 1) or a floor portion can be provided to support the die 12 during packaging. If the package core 14 is composed of a thermally conductive material (e.g., copper), the floor portion can also serve as a heat dissipation path to remove heat from the die 12 during device operation. The encapsulation material 18 can include any of a variety of materials (e.g., plastics, resins, epoxies, elastomers, and the like) that are capable of holding the die 12 within the core 14. Preferably, the encapsulation material 18 will be non-conductive. In the illustrated embodiment, the upper surface of the die 12, the upper surface of the encapsulation material 18, and the upper surface of the core 14 are made substantially flush with one another. As will be apparent to persons of ordinary skill in the art, other arrangements for mounting the die 12 within the package core 14 are also possible.

Figure 2:
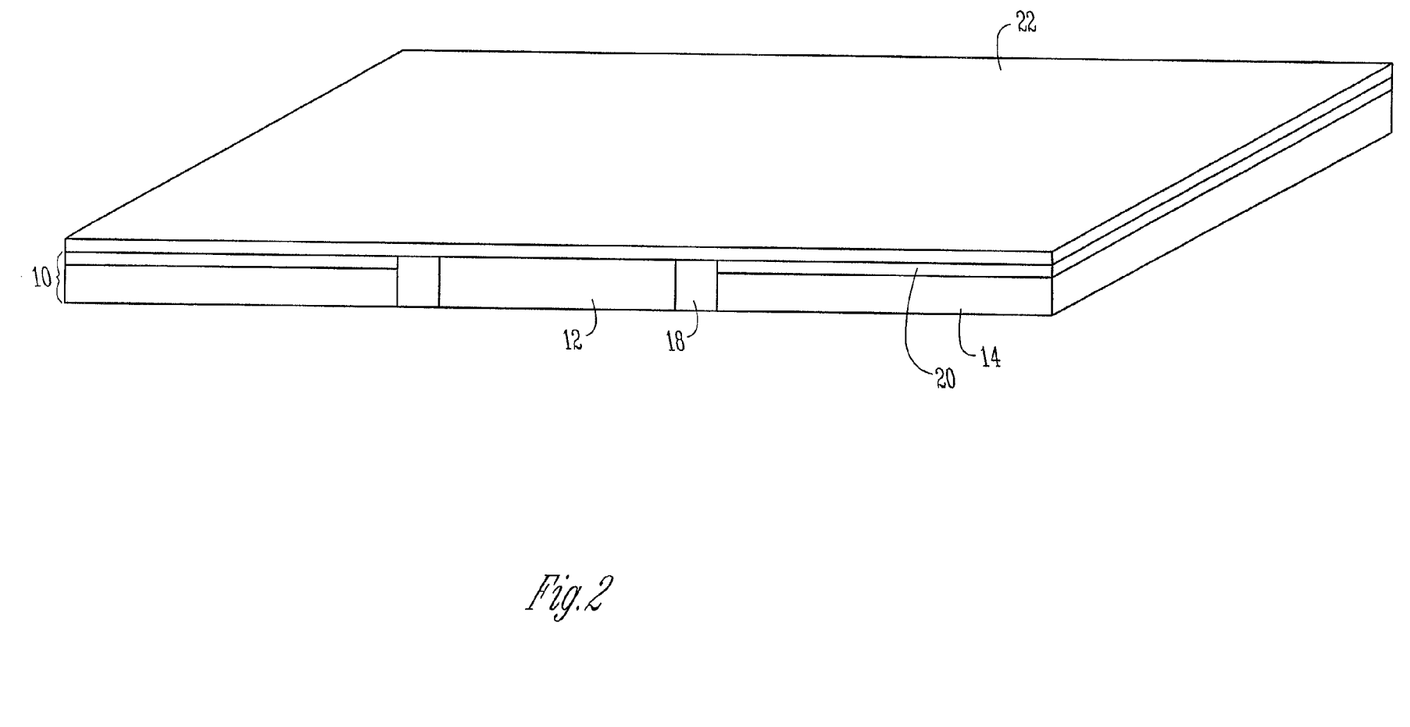
FIG. 2 is a cross-sectional isometric view of the die/core assembly of FIG. 1 having a layer of dielectric material deposited on an upper surface thereof.

After the die 12 has been fixed within the core 14, a layer of dielectric material 22 is deposited on the upper surface of the assembly 10, as shown in FIG. 2. The dielectric layer 22 can be deposited using any of a number of deposition techniques including, for example, roll coating, slot coating, dry film lamination, and others. The material of the dielectric layer 22 can include, for example, glass particle filled epoxy resins (e.g., Ajinomoto Buildup Film (ABF) available from Ajinomoto), bisbenzocyclobutene (BCB) (available from Dow), polyimide, silicone rubber materials (e.g., DC6812 from DowCorning), various low-k dielectrics (e.g., SiLK from Dow Chemical), IPN (available from Ibiden), and others. A number of via holes (not shown) are formed through the dielectric layer 22 to expose portions of the contacts on the active surface of the die 12 and portions of the upper surface of the conductive cladding 20 on the package core 14. A single metallization layer (i.e., a build up layer) is then formed on the upper surface of the dielectric layer 22 that includes metallic elements that are conductively coupled to the conductive contacts on the die 12 and the conductive cladding 20 on the package core 14 through corresponding via holes. As will be described in greater detail, the build up layer includes a plurality of relatively large landing pads having a pitch that is compatible with that of an external circuit board or, in the case of a pin grid array (PGA) package, a socket, to which the completed microelectronic device is to be connected.

Figure 3:
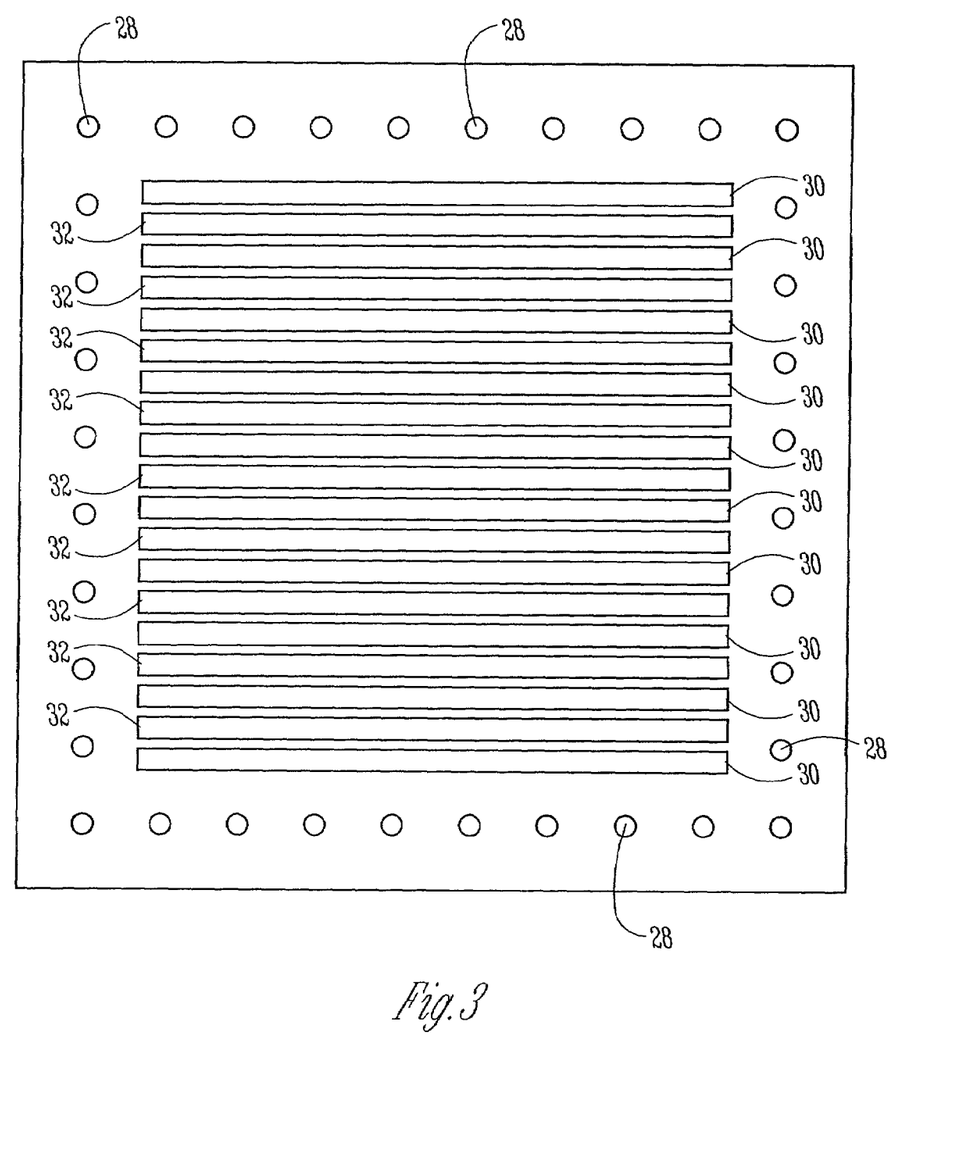
FIG. 3 is a top view of a microelectronic die in accordance with one embodiment of the present invention.

FIG. 3 is a top view of a microelectronic die 12 in accordance with one embodiment of the present invention. As shown, the die 12 includes a plurality of conductive contacts distributed on the upper surface thereof. A number of signal pads 28 are arranged within a peripheral region on the die surface for use as signal input/output (I/O) terminals for the circuitry of the die 12. That is, the signal pads 28 act as an interface for carrying signals (e.g., data or clock signals) between external circuitry and corresponding circuit nodes within the die 12. In one approach, the signal pads 28 will include short, wide copper bumps that cover the signal bond pad openings of the die 12, although other arrangements may also be used. In addition, a plurality of power bars 30 and a plurality of ground bars 32 are arranged in an alternating pattern within a center region of the die surface. In one approach, the power and ground bars 30, 32 each include a copper bar that links the power or ground bond pads of the die 12 in a particular row as part of the C4 metallization. Each of the power bars 30 is coupled to circuit nodes within the die 12 that require application of a predetermined supply potential (e.g., $V_{DD}$) during circuit operation. Similarly, each of the ground bars 32 is coupled to circuit nodes within the die 12 that require a different predetermined supply potential (e.g., $V_{SS}$) during circuit operation. Alternatively, arrangements are possible that do not use power and ground bars. The number of signal pads 28, power bars 30, and ground bars 32 on the die 12 will typically depend upon the complexity of the circuitry within the die 12. The number of signal pads 28 that can be accommodated will usually be limited by the ability to provide escape routing for the signals.

As described in connection with FIG. 1, the die 12 is fixed within a package core 14 during the packaging process. A dielectric layer 22 (see FIG. 2) is then formed over the corresponding die/core assembly and via holes are formed through the dielectric layer 22 in predetermined locations. The build up metallization layer is then formed over the dielectric layer 22. As shown in FIG. 2, the dielectric layer 22 covers not only the die 12, but also the encapsulation material 18 and the package core 14. Therefore, the size of the build up layer is not limited to the dimensions of the active surface of the die 12. That is, the build up layer may be distributed over the entire upper surface area of the package core 14. This provides considerably more room for expanding the pitch and size of the die metallization and for providing signal escape routing for the device.

Figure 4:
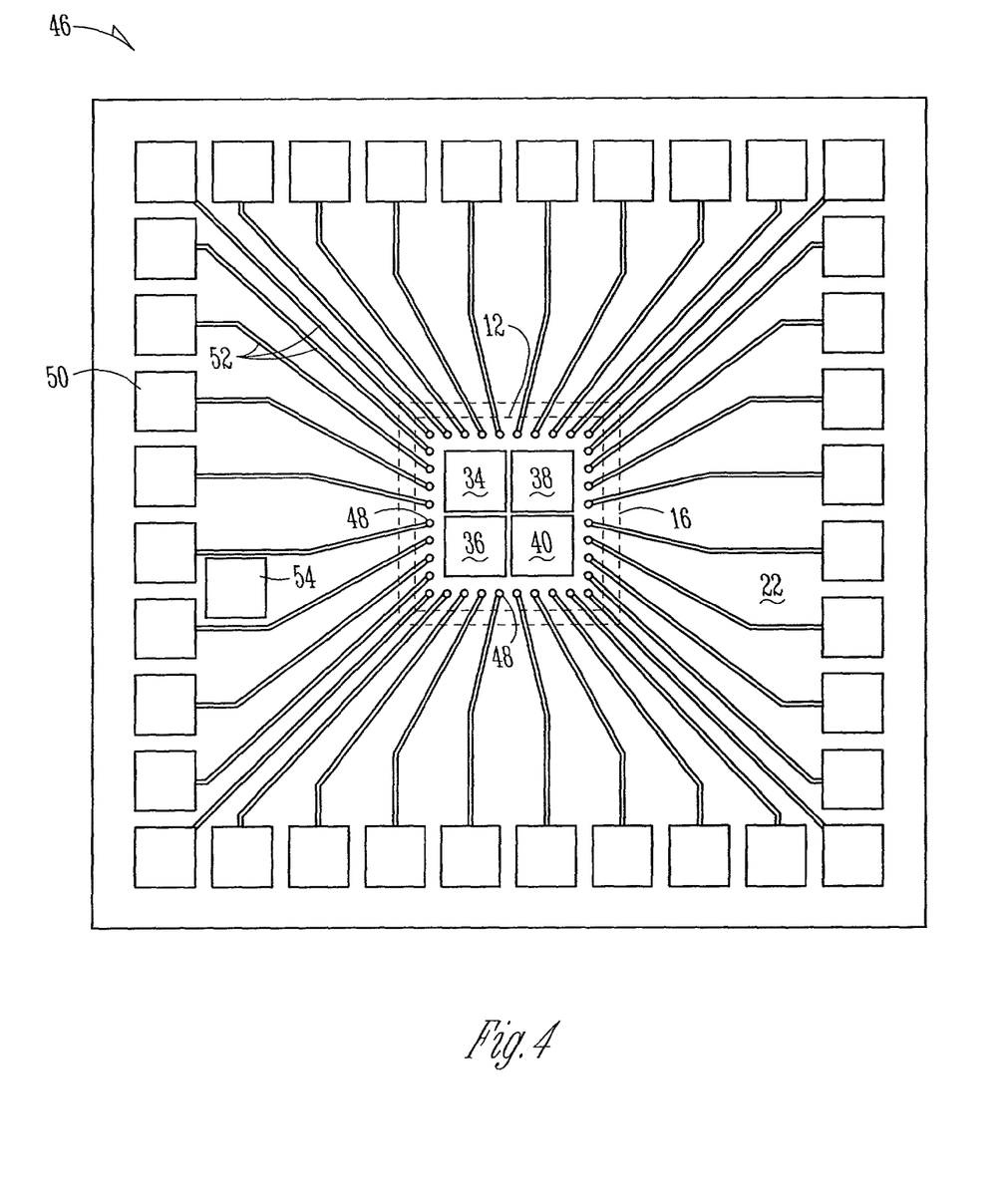
FIG. 4 is a top view illustrating a build up metallization layer in accordance with one embodiment of the present invention.

As described above, the build up layer preferably includes a plurality of relatively large landing pads that can be directly coupled to corresponding structures on an external circuit board, such as a computer motherboard, when the packaged device is being mounted within an external system. FIG. 4 is a top view illustrating a build up metallization layer 46 that is deposited on a dielectric layer 22 in one embodiment of the present invention. The outlines of the underlying die 12 and the opening 16 in the core 14 are shown in FIG. 4 using hidden (dotted) lines. As illustrated, the build up layer 46 includes a plurality of relatively large I/O landing pads 50 about a peripheral region thereof for use in coupling I/O signals between the die 12 and the external circuit board. As described above, the I/O landing pads 50 have a pitch that is consistent with structures on the external circuit board (or socket). In the illustrated embodiment, the I/O landing pads 50 are square in shape. It should be appreciated, however, that any of a wide variety of shapes can be used including, for example, rectangular and circular shapes. Each of the I/O landing pads 50 is conductively coupled to a corresponding signal pad 28 on the active surface of the die 12 through a path including a transmission segment 52. The transmission segment 52 is connected at a distal end to a terminal pad 48 on the dielectric layer 22 that is conductively coupled to an associated signal pad 28 on the die 12 through one or more via connections (e.g., microvias) through the dielectric layer 22. The transmission segments 52 provide the escape routing for the signal connections of the die 12. The number of signal connections that can be accommodated for a particular device will depend upon the density of transmission segments 52 that can be implemented within the build up layer 46.

Figure 5:
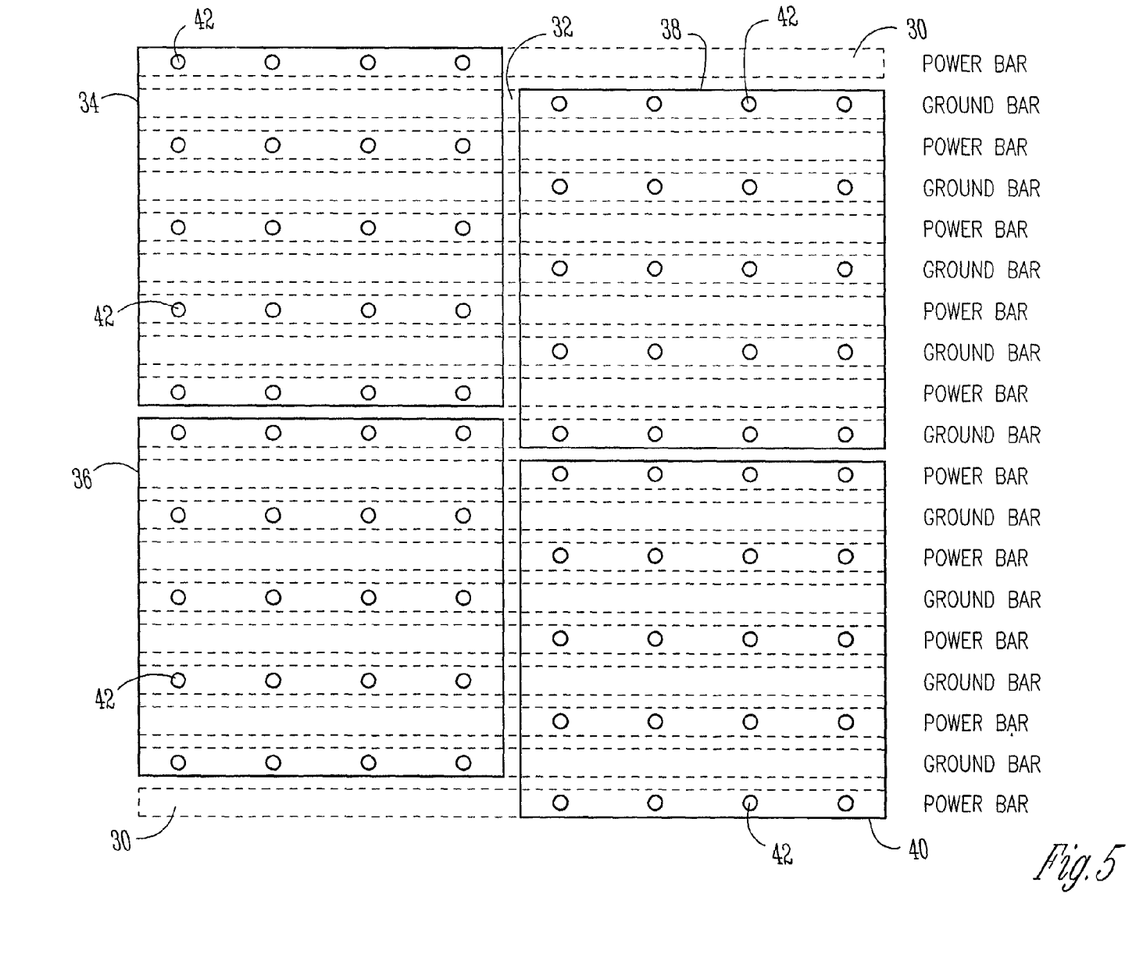
FIG. 5 is an enlarged view of a portion of the build up metallization layer of FIG. 4 in accordance with one embodiment of the present invention.

With reference to FIG. 4, the build up layer 46 also includes a pair of power landing pads 34, 40 and a pair of ground landing pads 36, 38 for use in providing power and ground connections to the die 12. As with the I/O landing pads 50 described above, the power and ground landing pads 34, 40, 36, 38 have a pitch that is consistent with structures on the external circuit board (or socket) and can have virtually any shape. As shown, the power landing pads 34, 40 and the ground landing pads 36, 38 are located above the central region of the die 12 that contains the power and ground bars 30, 32. Each of the power landing pads 34, 40, and ground landing pads, 36, 38 is conductively coupled to corresponding power and ground bars 30, 32 on the active surface of the die 12 through a plurality of via connections. FIG. 5 is an enlarged view of the build up layer 46 of FIG.

4 in the vicinity of the power and ground landing pads 34, 40, 36, 38 in accordance with one embodiment of the present invention. In FIG. 5, the power and ground bars 30, 32 on the underlying die 12 are shown using hidden lines. As illustrated, the power landing pads 34, 40 are each conductively coupled to multiple power bars 30 on the underlying die 12 using a plurality of via connections 42 that extend through the dielectric layer 22. Similarly, the ground landing pads 36, 38 are each conductively coupled to multiple ground bars 32 on the underlying die 12 using via connections 42. The number of power and ground bars 30, 32 that is encompassed by a power or ground landing pad will normally depend upon the increase in pitch that is desired. For example, an increase in pitch from 150 micrometers to 1.27 millimeters will generally require that a single power or ground landing pad cover 9 power/ground bars (as illustrated in FIG. 5). The number of via connections 42 that is used in a particular implementation to couple a power or ground bar to a power or ground landing pad will usually depend upon the level of series resistance that can be tolerated in the supply path.

In one embodiment of the invention, power and ground bars 30, 32 are not provided on the active surface of the die 12 (e.g., no C4 metallization on die). Instead, the power and ground landing pads 34, 40, 36, 38 are coupled directly to the corresponding power and ground bond pads of the die 12 through via connections in the dielectric layer. The power and ground bond pads do not need to be arranged in rows, but should be clustered on the die.

Referring back to FIG. 4, the build up layer 46 also includes a ground pad 54 that is conductively coupled to the conductive cladding 20 of the underlying package core 14 through one or preferably more via connections (or similar structures) in the dielectric layer 22. During mounting, this ground pad 54 is conductively coupled to a corresponding ground structure on the external circuit board. The conductive cladding 20 thus forms a ground plane beneath the build up layer 46 that allows the impedance of the transmission segments 52 to be controlled (using, for example, microstrip techniques). Among other advantages, controlled impedance lines are usually capable of significantly higher operational speeds than lines having a non-controlled impedance. Space providing, any number of ground pads 54 can be implemented as part of the build up layer 46.

Figure 7:
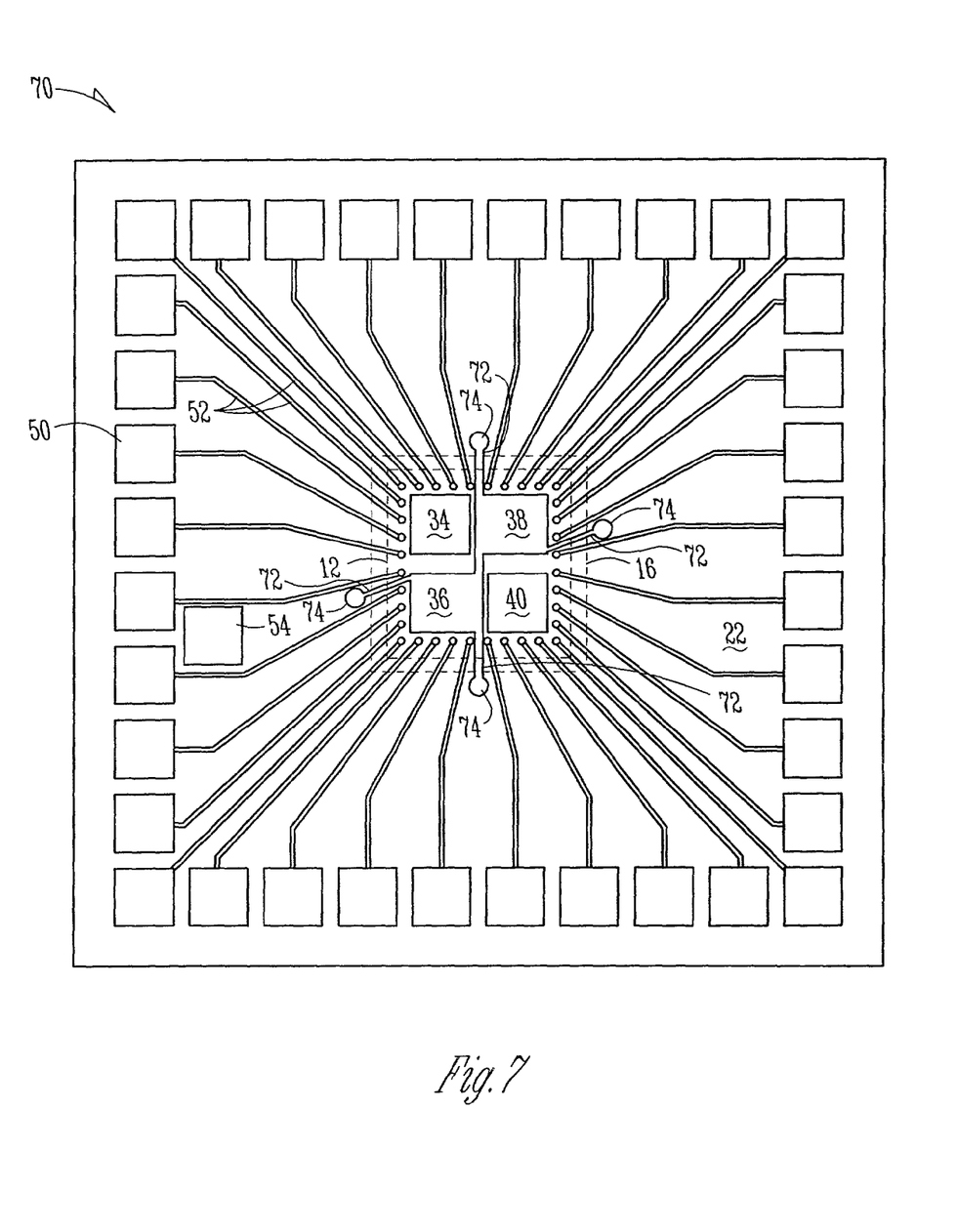
FIG. 7 is a top view illustrating a build up metallization layer in accordance with another embodiment of the present invention.

The conductive cladding 20 of the package core 14 can also be directly coupled to the ground of the die 12 through one or more traces on the build up layer 46 (i.e., without having to go through the ground of the circuit board). FIG. 7 is top view of a build up metallization layer 70 (which is a modification of the build up metallization layer 46 of FIG. 4) that provides such direct coupling. As shown, the build up metallization layer 70 includes traces 72 that extend over both the die 12 and the package core 14 (which is the area outside of boundary 16). The traces 72 are each connected to a corresponding pad 74 that is located above the core 14. Via connections are used to provide conductive coupling between each of the pads 74 and the underlying conductive cladding 20 of the core 14. In the region above the die 12, the traces 72 are connected to the ground landing pads 36, 38. As described previously, the ground landing pads 36, 38 are each conductively coupled to multiple ground bars 32 on the underlying die 12 using via connections 42. In this manner, the conductive cladding 20 is directly coupled to the ground of the die 12. Any number of such traces (or similar structures) can be provided, space allowing. A higher number is desirable as it provides a more direct return path for currents in the signal lines.

After the build up layer 46 has been deposited, a solder mask can be applied over the layer 46 to mask areas that will not be connected to the external circuit board. The exposed areas can then be processed in accordance with the mounting method that will be used to attach the device to the external circuit board. As described above, any of a number of different methods can be used to attach the device to the circuit board including, for example, BGA, LGA, PGA, and SMT techniques. Preferably, a mounting technique will be used that will accommodate any dimensional changes that might occur due to differences in the coefficient of thermal expansion between the various materials.

Figure 6:
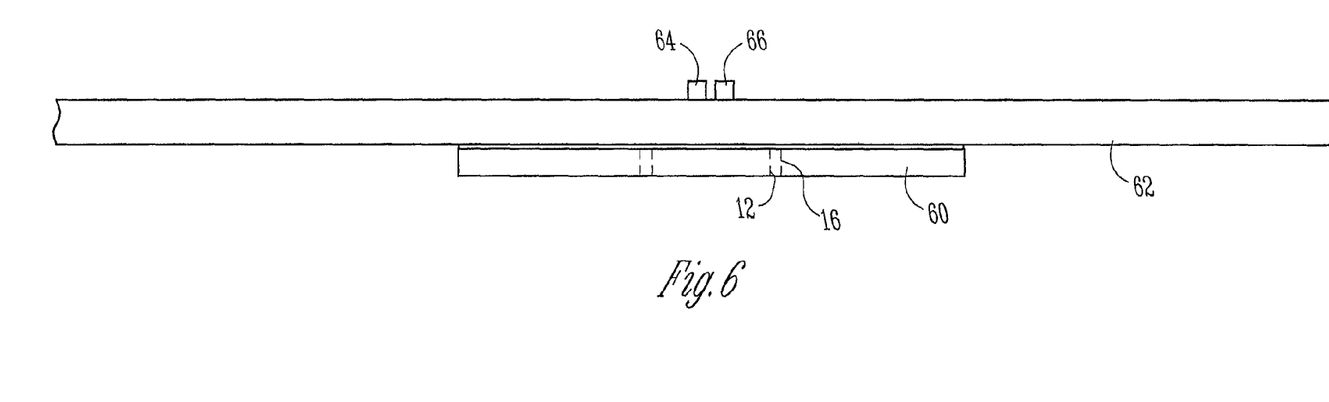
FIG. 6 is a side view of a microelectronic device mounted to a motherboard in accordance with one embodiment of the present invention.

In one embodiment of the invention, decoupling capacitors are mounted to an opposite side of the external circuit board (directly opposite the microelectronic device) to provide decoupling functionality for the device. Because of the proximity of the die 12 to the circuit board (e.g., in one embodiment, the package is less than 100 micrometers thick above the active surface of the die 12), decoupling can be provided in this manner with relatively low loop inductance. FIG. 6 is a side view of a microelectronic device 60 mounted to a motherboard 62 in accordance with one embodiment of the present invention. Although not shown, it should be appreciated that other circuitry will also be located on the motherboard 62. As illustrated, a pair of decoupling capacitors 64, 66 is mounted on an opposite side of the motherboard 62 from the device 60. The decoupling capacitors 64, 66 are connected to contact pads on the motherboard 62 that are conductively coupled (through via connections) to contact pads on the opposite side of the motherboard 62 to which the power landing pads 34, 40 and the ground landing pads 36, 38 of the device 60 are connected. As can be appreciated, the loop inductance associated with the decoupling capacitors 64, 66 will be related to the thickness of the motherboard 62 and the minimum spacing between vias. Thus, to reduce loop inductance further, it is preferable that thinner board materials be used with smaller spacing between vias. Any number of capacitors can be coupled to the motherboard to provide decoupling. In an alternative approach, capacitors are co-embedded in the core 14 with the die 12. Traces on the build up layer are then used to connect the embedded capacitors to the appropriate bond pads of the die 12.

Figure 8:
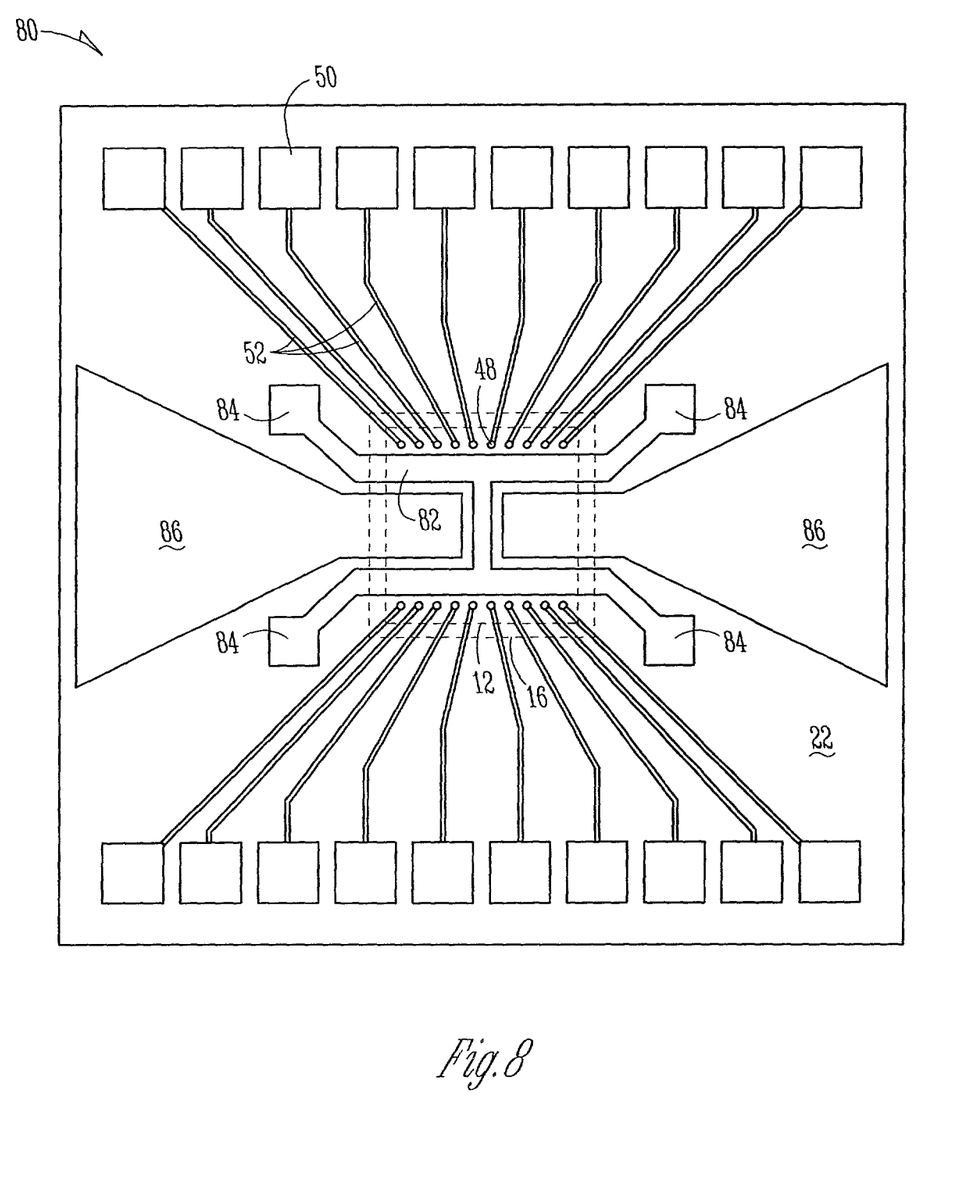
FIG. 8 is a top view illustrating a build up metallization layer in accordance with yet another embodiment of the present invention.

FIG. 8 is a top view illustrating a build up metallization layer 80 in accordance with another embodiment of the present invention. As shown, the signal (I/O) connections to the die 12 are all made along two edges thereof. The build up layer 80 includes a ground structure 82 for providing a ground connection to the external circuit board. The ground structure 82 is conductively coupled to the ground bars 32 on the underlying die 12 (or alternative ground conductors on the die 12) using via connections. The ground structure 82 also includes a number of landing pads 84 that are situated above the package core 14 (i.e., in the region outside the boundary of opening 16) to provide the ground connection to the circuit board and also to the conductive cladding 20 on the underlying package core 14. The build up metallization layer 80 also includes a pair of power half-planes 86 to provide power to the die 12 (e.g., $V_{CC}$). The power half-planes 86 are conductively coupled to the power bars 30 on the die 12 (or alternative power conductors on the die 12) through via connections. The power half-planes 86 will be conductively coupled to corresponding power structures on the external circuit board during mounting.

Figure 9:
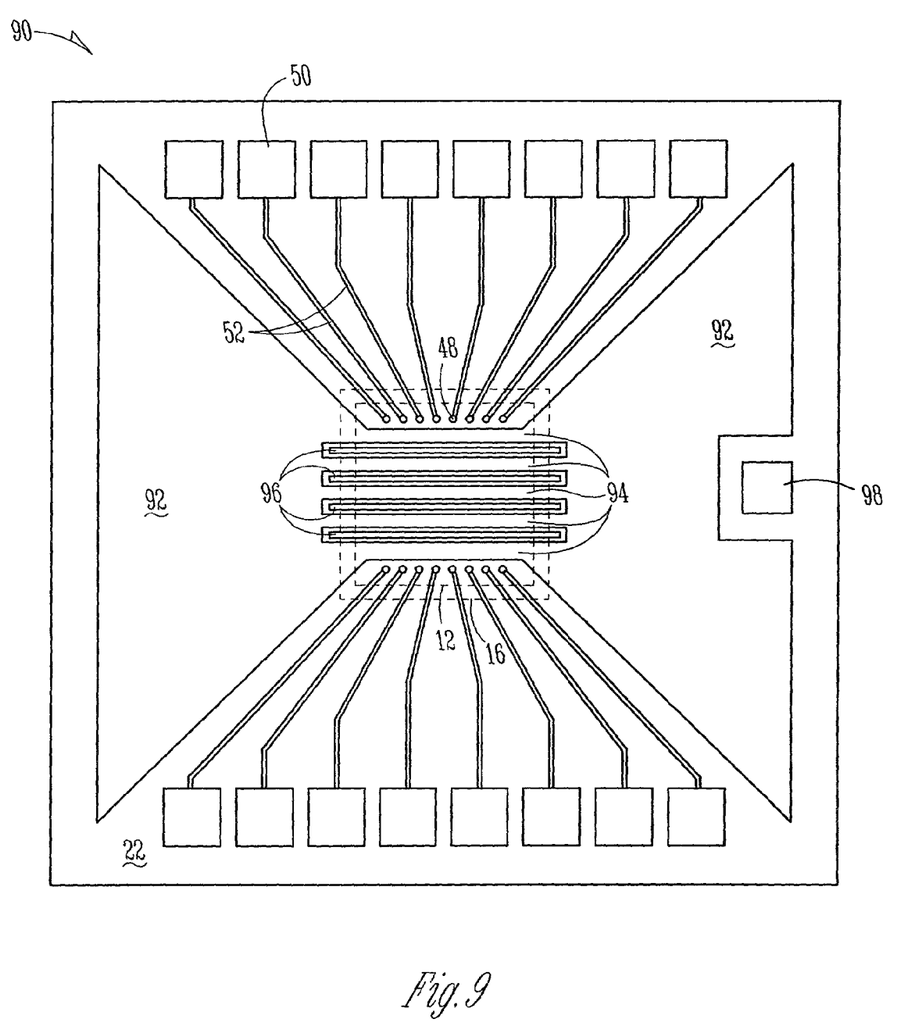
FIG. 9 is a top view illustrating a build up metallization layer in accordance with still another embodiment of the present invention.

FIG. 9 is a top view illustrating a build up metallization layer 90 in accordance with yet another embodiment of the present invention. As in the embodiment of FIG. 8, the signal connections to the die 12 are all made along two edges of the die. The build up metallization layer 90 includes a power plane 92 that occupies a large portion of the available area (i.e., the area not occupied by the signal (I/O) connections). In the region above the die 12, the power plane 92 is divided into a number of power strips 94. Between these power strips 94 are a number of ground strips 96. The power strips 94 are each conductively coupled to power bond pads on the die 12 through corresponding via connections. Similarly, the ground strips 96 are each conductively coupled to ground bond pads on the die 12 through corresponding via connections. In one approach, the power and ground strips 94, 96 are directly connected to the associated power and ground bond pads on the die 12 through the corresponding via connections. In another approach, the power and ground strips 94, 96 are connected to power and ground bars on the die 12 (such as power and ground bars 30, 32 described previously) through the via connections. The power and ground bars are, in turn, conductively coupled to the power and ground bond pads on the die 12. In one approach, the power and ground strips 94, 96 are perpendicular to the power and ground bars on the die 12. As will be appreciated, many other power and ground connection schemes can also be used.

As illustrated in FIG. 9, each of the ground strips 96 extends out over the package core 14 (i.e., into the region outside the boundary of opening 16). In this region, each of the ground strips 96 is conductively coupled to the conductive cladding 20 of the package core 14 using one or more via connections through the underlying dielectric layer. Preferably, multiple via connections will be used for each ground strip 96 to minimize current crowding. At least one ground landing pad 98 is provided within an opening in the power plane 92 for use in making a ground connection to the external circuit board. The ground landing pad 98 is also conductively coupled to the conductive cladding 20 of the package core 14 through one or more via connections. One or more ground landing pads may also (or alternatively) be provided within the spaces between the signal lines 52.

Figure 10:
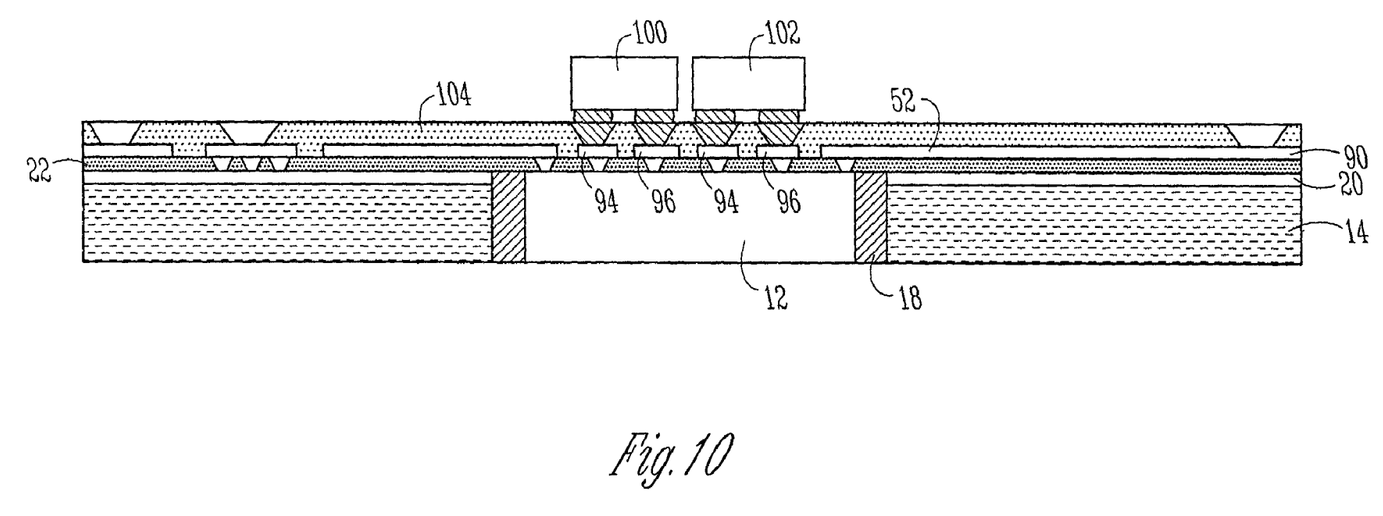
FIG. 10 is a cross-sectional side view of a microelectronic device having decoupling capacitors connected between power and ground strips on a build up metallization layer thereof in accordance with one embodiment of the present invention.

In one embodiment of the invention, as illustrated in FIG. 10, decoupling capacitors 100, 102 are directly coupled to the power and ground strips 94, 96 of a build up metallization layer to provide decoupling for the circuitry of the die 12. Because there is only a single build up metallization layer 90, a relatively low loop inductance can be achieved using this capacitor mounting approach. The approach is also relatively inexpensive to implement. In the illustrated embodiment, the decoupling capacitors 100, 102 are connected to the power and ground strips 94, 96 through openings in a solder mask 104 deposited over the assembly. The spacing between the power and ground strips 94, 96 is selected to accommodate the contact spacing of the decoupling capacitors. Any number of decoupling capacitors can be connected in this fashion (space permitting).

Using a standard build up process, a stepper litho tool (e.g., Ushio 5038SC), and ultraviolet (UV) laser vias, a via pitch of 80 micrometers (µm) is currently possible for the vias from the die to the first layer of the package. Thus, with two rows of such vias and 25 µm/25 µm line/space dimensions, one escape route can be provided every 70 µm. This allows 140 escape lines per centimeter of die side. When using two sides, therefore, 280 escape lines are possible, which is enough to allow escape routing for virtually any current microprocessor. With additional rows of vias, the escape path can be reduced to 50 µm. It is believed that, with modest improvements in via alignment technology and/or trace pitch, the number of escape lines per centimeter can be increased to over 165. For a device having fewer I/O connections, improved signal integrity performance can be achieved by alternating signal lines with ground and power lines in the escape region.

Although the present invention has been described in conjunction with certain embodiments, it is to be understood that modifications and variations may be resorted to without departing from the spirit and scope of the invention as those skilled in the art readily understand. For example, in one embodiment, multiple die are fixed within a single package core to form a multichip module (MCM) having a single build up layer. In such an embodiment, inter-chip signal routing can also be implemented within the build up layer. Such modifications and variations are considered to be within the purview and scope of the invention and the appended claims.

What is claimed is:

1. A microelectronic device comprising:
 a die fixed within an opening in a package core by an encapsulation material, wherein said package core includes a conductive cladding covering substantially all of an upper surface of said package core; and
 a single metallization layer built up upon said die and said package core, said single metallization layer being directly connected to conductive contacts on an upper surface of said die and having a plurality of landing pads that are spaced for direct connection to an external circuit board.

2. The microelectronic device of claim 1, wherein:
 said plurality of landing pads includes a first group of landing pads situated above said die and a second group of landing pads situated above said package core.

3. The microelectronic device of claim 2, wherein the plurality of landing pads of the single metallization layer include a plurality of signal landing pads and wherein all of the signal landing pads are situated above the package core and none of the signal landing pads are situated above the die.

4. The microelectronic device of claim 1, wherein: said die includes a plurality of bond pads on said upper surface of said die, wherein said plurality of landing pads on said single metallization layer has a pitch that is significantly greater than a pitch of said plurality of bond pads.

5. The microelectronic device of claim 4, wherein:
 said pitch of said plurality of landing pads is at least two times greater than said pitch of said plurality of bond pads.

6. The microelectronic device of claim 1, wherein:
 said die includes a plurality of power bars and a plurality of ground bars within a central portion of said upper surface, wherein said single metallization layer includes at least one landing pad that is conductively coupled to multiple power bars within said plurality of power bars through corresponding via connections.

7. The microelectronic device of claim 6, wherein:
 said single metallization layer includes at least one landing pad that is conductively coupled to multiple ground bars within said plurality of ground bars through corresponding via connections.

8. The microelectronic device of claim 1, wherein:
 said die includes a plurality of signal bond pads distributed within a peripheral region of said upper surface of said die.

9. The microelectronic device of claim 8, wherein:
 said plurality of landing pads within said single metallization layer includes a first signal landing pad that is situated above said package core, said first landing pad being conductively coupled to a first signal bond pad of said die.

10. The microelectronic device of claim 9, wherein:
said single metallization layer includes a first transmission line segment to facilitate signal communication between said first signal landing pad and said first signal bond pad.

11. The microelectronic device of claim 10, wherein:
said first transmission line segment includes a microstrip transmission structure.

12. The microelectronic device of claim 10, wherein:
said conductive cladding provides a ground structure for said first transmission line segment.

13. The microelectronic device of claim 1, wherein:
said plurality of landing pads within said single metallization layer includes a ground pad situated above said package core, said ground pad being conductively coupled to said conductive cladding through at least one via connection.

14. The microelectronic device of claim 1, wherein:
said die includes signal bond pads along two opposing edges of said upper surface of said die, wherein said single metallization layer includes a plurality of conductive lines that are conductively coupled to said signal bond pads on said two opposing edges of said upper surface of said die.

15. The microelectronic device of claim 14, wherein:
said single metallization layer includes a power plane occupying portions of said single metallization layer unoccupied by said plurality of conductive lines.

16. The microelectronic device of claim 1, wherein:
said single metallization layer includes a plurality of power strips and a plurality of ground strips in a region above said die, said power strips being conductively coupled to power bond pads on said die through corresponding via connections and said ground strips being conductively coupled to ground bond pads on said die through corresponding via connections.

17. The microelectronic device of claim 16, wherein:
said single metallization layer includes at least one ground strip that extends out over said package core, said at least one ground strip being conductively coupled to said conductive cladding through at least one via connection.

18. The microelectronic device of claim 16, comprising:
at least one decoupling capacitor connected between a first power strip and a first ground strip on said single metallization layer.

19. The microelectronic device of claim 1, wherein:
said microelectronic device is a microprocessor.

20. The microelectronic device of claim 1, wherein:
said opening extends from said upper surface of said package core to a bottom surface of said package core.

21. The microelectronic device of claim 1, wherein:
said package core includes a floor beneath said opening.

22. The microelectronic device of claim 1, wherein:
said upper surface of said die, an upper surface of said encapsulation material and said upper surface of said package core are substantially flush.

23. The microelectronic device of claim 1, further comprising:
a dielectric layer disposed on said die, said encapsulation material, and said package core.

24. An electrical system comprising:
a microelectronic device having:

a die fixed within a package core by an encapsulation material, wherein an upper surface of said die, an upper surface of said encapsulation material and an upper surface of said package core are substantially flush; and
a single metallization layer built up upon said die and said package core, said single metallization layer being directly connected to conductive contacts on said upper surface of said die and having a plurality of landing pads; and
a circuit board having a conductive pattern on a first side thereof, said conductive pattern including a plurality of conductive elements;
wherein said microelectronic device is mounted on said circuit board so that said plurality of landing pads on said single metallization layer of said microelectronic device are aligned with and connected to said plurality of conductive elements within said conductive pattern of said circuit board, and at least one of said landing pads is between said package core and said circuit board.

25. The electrical system of claim 24, comprising:
at least one capacitor mounted on a second side of said circuit board to provide decoupling for circuitry within said die.

26. The electrical system of claim 24, wherein:
said circuit board includes a computer motherboard.

27. The electrical system of claim 24, wherein:
said microelectronic device includes a microprocessor.

28. The electrical system of claim 24, wherein:
said microelectronic device is mounted on said circuit board using one of the following techniques: ball grid array, land grid array, pin grid array, or surface mount technology.

29. The electrical system of claim 24, wherein:
said plurality of landing pads includes at least one power landing pad overlapping said die that is conductively coupled to a plurality of power bond pads on said die.

30. The electrical system of claim 29, wherein:
said plurality of landing pads includes at least one ground landing pad overlapping said die that is conductively coupled to a plurality of ground bond pads on said die.

31. The electrical system of claim 24, wherein:
said plurality of landing pads includes at least one signal landing pad overlapping said package core that is conductively coupled to a signal bond pad on said die through a transmission line segment and at least one via connection.

32. The electrical system of claim 31, wherein:
said package core comprises a metallic cladding, said metallic cladding forming a ground plane for said transmission line segment.

33. A microelectronic device comprising:
a die fixed within an opening of a package core by an encapsulation material, said die having a plurality of conductive contacts on an upper surface thereof;
a dielectric layer on an upper surface of said package core and said upper surface of said die; and
a single metallization layer disposed upon said dielectric layer, said single metallization layer being conductively coupled to said plurality of conductive contacts on said upper surface of said die through a plurality of via connections, said single metallization layer having a plurality of landing pads that are spaced for direct connection to an external circuit board, said plurality of landing pads including at least one landing pad above said die and at least one landing pad above said package core.

34. The microelectronic device of claim 33, wherein:

said package core comprises a copper cladding that forms a ground plane for a transmission structure within said single metallization layer.

35. The microelectronic device of claim 34, wherein:

said plurality of landing pads includes at least one ground pad that is conductively coupled to said copper cladding of said package core through one or more via connections.

36. The microelectronic device of claim 33, wherein:

said die includes a plurality of power bars and ground bars within a central region of said upper surface and a plurality of signal pads within a peripheral region of said upper surface.

37. The microelectronic device of claim 36, wherein:

said single metallization layer includes at least one power landing pad disposed above said die, said at least one power landing pad being conductively coupled to multiple power bars on said die through corresponding via connections.

38. The microelectronic device of claim 37, wherein:

said single metallization layer includes at least one ground landing pad disposed above said die, said at least one ground landing pad being conductively coupled to multiple ground bars on said die through corresponding via connections.

39. The microelectronic device of claim 38, further comprising:

at least one capacitor coupled between said at least one ground landing pad and said at least one power landing pad.

40. The microelectronic device of claim 33, wherein:

said at least one landing pad above said package core comprises a signal landing pad conductively coupled to a signal bond pad on said die.

41. The microelectronic device of claim 33, comprising:

at least one decoupling capacitor fixed within said opening of said package core by said encapsulation material, said single metallization layer including conductive traces to connect contacts of said at least one decoupling capacitor to power and ground contacts on said upper surface of said die.

42. The microelectronic device of claim 33, wherein:

a bottom surface of said dielectric layer is above said upper surface of said die and said upper surface of said package core.

43. The microelectronic device of claim 33, wherein:

an upper surface of said dielectric layer is below a top surface of said single metallization layer.

44. A microelectronic device comprising:

a die fixed within a package core by an encapsulation material between said die and said package core; and a single metallization layer built up upon said die and said package core, said single metallization layer having a plurality of landing pads that are spaced for direct connection to an external circuit board, wherein said plurality of landing pads includes at least one landing pad above said die and at least one landing pad above said package core, and wherein an upper surface of said die, an upper surface of said encapsulation material and an upper surface of said package core are substantially flush.

45. The microelectronic device of claim 44, further comprising:

a dielectric layer disposed on said package core, said die, and said encapsulation material, wherein said dielectric layer comprises a top surface, and said top surface is substantially below a top surface of said single metallization layer.

46. The microelectronic device of claim 44, further comprising:

a conductive cladding disposed on said package core.

47. The microelectronic device of claim 46, wherein:

said die includes a plurality of conductive contacts; and said single metallization layer includes a plurality of signal landing pads and at least one ground pad, wherein at least one of said signal bond pads is conductively coupled to at least one of said conductive contacts by a transmission line segment, and said ground pad is conductively coupled to said conductive cladding.

\* \* \* \* \*